United States Patent
Bahir et al.

(10) Patent No.: US 8,367,450 B2
(45) Date of Patent: Feb. 5, 2013

(54) LIGHT EMITTING SYSTEM AND METHOD OF FABRICATING AND USING THE SAME

(75) Inventors: Gad Bahir, Haifa (IL); Dan Fekete, Zikhron-Yaakov (IL); Asaf Albo, Haifa (IL)

(73) Assignee: Technion Research & Development Foundation Ltd., Haifa (IL)

( * ) Notice: Subject to any disclaimer, the term of this patent is extended or adjusted under 35 U.S.C. 154(b) by 148 days.

(21) Appl. No.: 13/031,302

(22) Filed: Feb. 21, 2011

(65) Prior Publication Data

US 2011/0254471 A1   Oct. 20, 2011

Related U.S. Application Data

(60) Provisional application No. 61/393,214, filed on Oct. 14, 2010, provisional application No. 61/306,505, filed on Feb. 21, 2010.

(30) Foreign Application Priority Data

Feb. 23, 2010 (IL) .......................................... 204122

(51) Int. Cl.
*H01L 21/00* (2006.01)
*H01L 29/06* (2006.01)
*H01S 5/00* (2006.01)

(52) U.S. Cl. ................ 438/47; 438/31; 438/39; 438/44; 438/46; 372/43.01; 372/45.01; 372/45.011; 372/45.012; 315/363; 257/13; 257/14; 257/79; 257/89; 257/96; 257/E21.001; 257/E21.002; 257/E33.005; 257/E33.008

(58) Field of Classification Search .............. 438/31, 438/39, 44, 46, 47; 372/43.01, 45.01, 45.011, 372/45.012; 315/363; 257/13, 14, 79, 89, 257/96, E21.001, E21.002, E33.005, E33.008
See application file for complete search history.

(56) References Cited

U.S. PATENT DOCUMENTS

| | | | |
|---|---|---|---|
| 5,155,571 A | 10/1992 | Wang et al. | |
| 6,603,784 B1 | 8/2003 | Johnson | |
| 6,975,660 B2 * | 12/2005 | Johnson | 372/45.01 |
| 7,109,526 B2 | 9/2006 | Gentner et al. | |
| 7,256,417 B2 | 8/2007 | Mawst et al. | |
| 7,391,507 B2 | 6/2008 | Chism, II | |
| 7,457,338 B2 | 11/2008 | Mawst et al. | |
| 7,737,411 B2 | 6/2010 | Gunapala et al. | |
| 7,768,048 B2 | 8/2010 | Ueno et al. | |
| 8,154,008 B2 * | 4/2012 | Lee et al. | 257/13 |
| 2004/0259284 A1 * | 12/2004 | Lin | 438/47 |
| 2005/0017176 A1 | 1/2005 | Koch et al. | |
| 2005/0056868 A1 | 3/2005 | Gentner et al. | |
| 2005/0170542 A1 * | 8/2005 | Matsumura | 438/31 |
| 2005/0173694 A1 | 8/2005 | Mawst et al. | |
| 2007/0009001 A1 * | 1/2007 | Shigihara et al. | 372/45.012 |
| 2007/0215900 A1 | 9/2007 | Maimon | |
| 2007/0221908 A1 * | 9/2007 | Takahashi et al. | 257/13 |
| 2007/0228358 A1 | 10/2007 | Ofek | |

(Continued)

OTHER PUBLICATIONS

Bank et al. "Recent Progress on 1.55-?m Dilute-Nitride Lasers", IEEE Journal of Quantum Electronics, 43(9): 773-785, Sep. 2007.

(Continued)

*Primary Examiner* — Dao H Nguyen

(57) ABSTRACT

A light emitting system is disclosed. The system comprises an active region having a stack of bilayer quantum well structures separated from each other by barrier layers. Each bilayer quantum well structure is formed of a first layer made of a first semiconductor alloy for electron confinement and a second layer made of a second semiconductor alloy for hole confinement, wherein a thickness and composition of each layer is such that a characteristic hole confinement energy of the bilayer quantum well structure is at least 200 meV.

33 Claims, 8 Drawing Sheets

U.S. PATENT DOCUMENTS

2007/0248135 A1 10/2007 Mawst et al.
2008/0112452 A1* 5/2008 Chakraborty et al. ... 372/45.011
2010/0118905 A1 5/2010 Yabushita et al.
2010/0295095 A1 11/2010 Klipstein
2011/0204214 A1 8/2011 Bahir et al.

OTHER PUBLICATIONS

Klipstein "'XBn' Barrier Photodetectors for High Sensitivity and High Operating Temperature Infrared Sensors", Proceedings of SPIE, the International Society of Optical Engineering, 34th Conference on Infrared Technology and Applications, Orlando, FL, USA, Mar. 17-20, 2008, 6940(2): 69402U.1-69402U.12, 2008.
Maimon et al. "NBn Detector, An Infrared Detector With Reduced Dark Current and Higher Operating Temperature", Applied Physics Letters, 89: 151109-1-151109-3, 2006.
Mawst et al. "MOCVD-Grown Dilute Nitride Type II Quantum Wells", IEEE Journal of Selected Topics in Quantum Electronics, 14(4): 979-991, Jul./Aug. 2008
Peter et al. "Realization and Modeling of a Pseudomorphic (GaAs1-xSbx-InyGa1-yAs)/GaAs Bilayer-Quantum Well", Applied Physics Letters, 67(18): 2639-2641, Oct. 30, 1995.
Notice of Allowance Dated Jun. 22, 2012 From the US Patent and Trademark Office Re. Application No. 12/789,481.
Bedair "Atomic Layer Epitaxy Deposition Processes", Journal of Vacuum Science & Technology B, 12(1): 179-185, Jan./Feb. 1994.
Gendron et al. "Quantum Cascade Photodetector", Applied Physics Letters, 85(14): 2824-2826, Oct. 4, 2004.
Shields et al. "Detection of Single Photons Using a Field-Effect Transistor Gated by a Layer of Quantum Dots", Applied Physics Letters, 76(25): 3673-3675, Jun. 19, 2000.
Yoon et al. "Self-Assembled GaInNAs/GaAsN Quantum Dot Lasers: Solid Source Molecular Beam Epitaxy Growth and High-Temperature Operation", Nanoscale Research Letters, 1: 20-31, 2006.
Restriction Official Action Dated Feb. 22, 2012 From the US Patent and Trademark Office Re. U.S. Appl. No. 12/789,481.
Official Action Dated Sep. 18, 2012 From the US Patent and Trademark Office Re. U.S. Appl. No. 12/789,479.

* cited by examiner

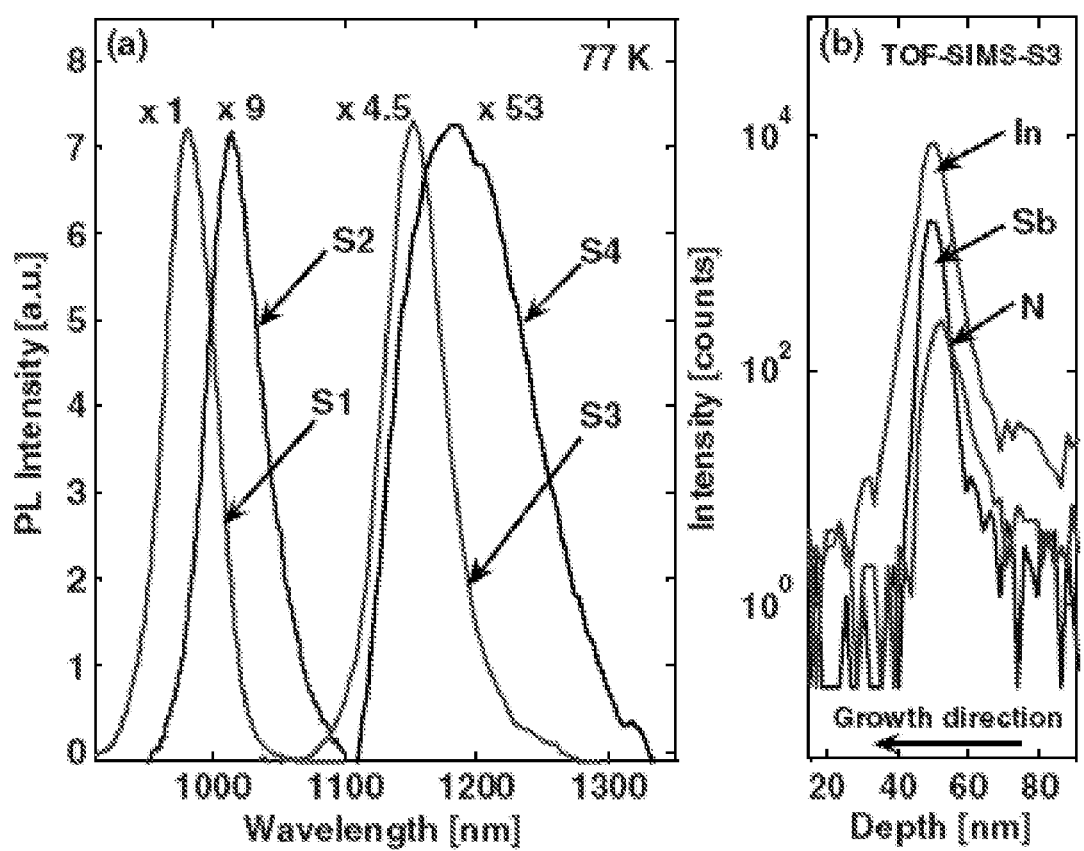
FIGs. 6A-B

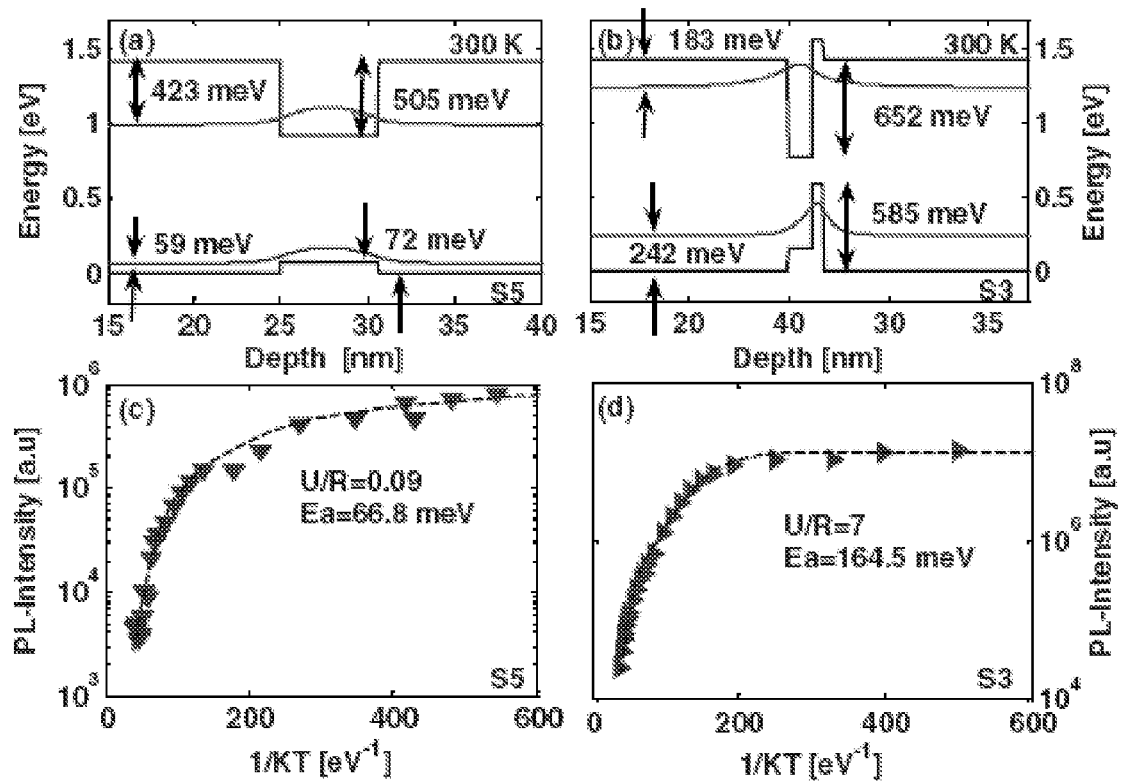
FIGs. 7A-D

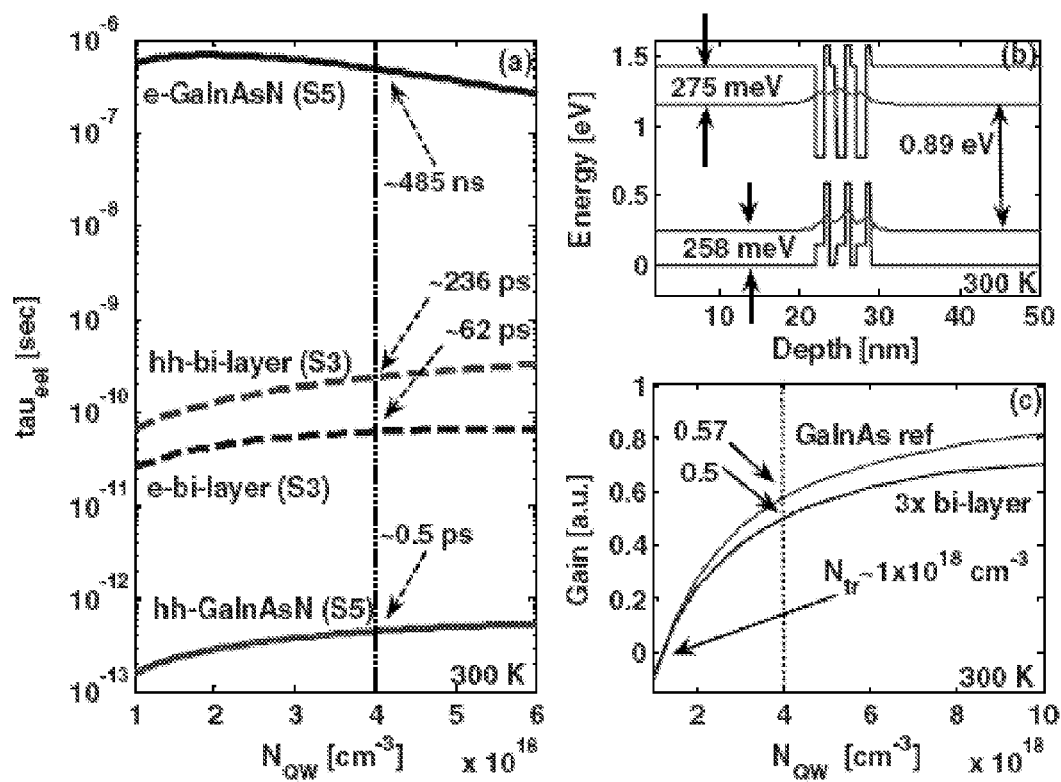
FIGs. 8A-C

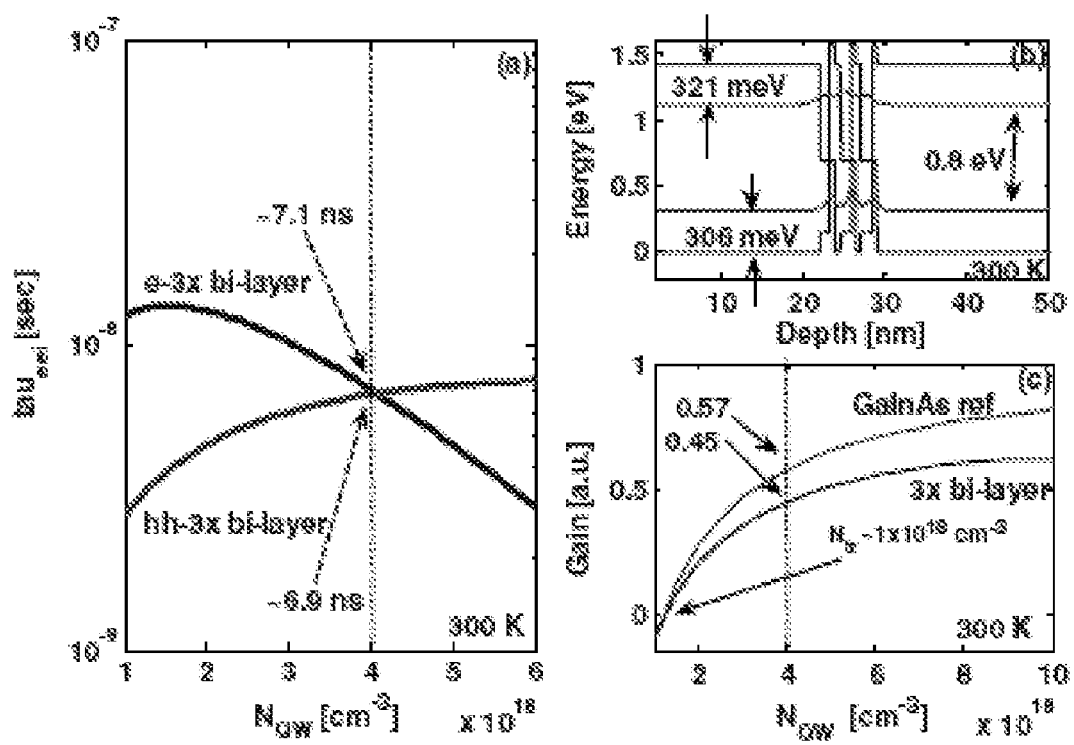
FIG. 9A-C

LIGHT EMITTING SYSTEM AND METHOD OF FABRICATING AND USING THE SAME

RELATED APPLICATIONS

This application claims the benefit of priority of U.S. Provisional Patent Application Nos. 61/306,505 filed Feb. 21, 2010, and 61/393,214 filed Oct. 14, 2010, and of Israel Patent Application No. 204122 filed Feb. 23, 2010, the contents of which are incorporated herein by reference in their entirety.

FIELD AND BACKGROUND OF THE INVENTION

The present invention, in some embodiments thereof, relates to light emission and, more particularly, but not exclusively, to the emission of light using a bilayer quantum well structure as an active layer.

In a semiconductor light emitting device such as a semiconductor laser and a light emitting diode, electrons and holes injected into an active layer of the device combine with each other and emit light. It is generally desired to confine the electrons and holes in the active layer in order to improve characteristics of the light emitting device. A conventional semiconductor laser has a double heterostructure, in which an active layer is sandwiched between a p-type cladding layer and an n-type cladding layer. Compound semiconductors for forming the double hetero structure are selected so that the forbidden gap of the active layer is smaller than the forbidden gap of the p-type cladding layer and the n-type cladding layer. This energy difference between the forbidden gaps generates energy barriers as the band offset of the valence band and the band offset of the conduction band. These energy barriers, when sufficiently high, can achieve efficient confinement of the injected electrons and holes in the active layer.

With the developments in crystal growth techniques, it has become possible to grow an ultra-thin film having a thickness of several nanometers (nm). Thus, a quantum well (QW) semiconductor laser can be manufactured using an ultra-thin film as an active layer of the laser. In a QW layer of such laser, electrons and holes each have a discrete energy level. As a result, the QW semiconductor laser has advantages such as a decrease in the threshold current density due to an increase in the state densities, emission of laser light having a shorter wavelength, and the like.

One type of QW semiconductor laser is a vertical cavity surface emitting laser (VCSEL). Known in the art are VCSEL devices with GaAs quantum well which emit light in the 850 nanometer range. In such VCSEL, the QW is made from the same material as the substrate, and the various layers, whose thickness is related to wavelength, is able to maintain the minimal mechanical strain without mechanical relaxation. Attempts have been made to use InGaAs or GaAsSb or some combination thereof instead of GaAs in the active layer to provide laser at 1.3 μm [U.S. Pat. No. 6,603,784].

GaInAsN and GaInAsNSb strained QWs have been used for obtaining near-infrared (IR) lasers emitting in wavelengths of 1.3 μm and 1.5 μm, respectively, which are useful for optical fiber communications [Bank et al., IEEE J. Quantum Electron. 43, 773 (2007)].

Also known are laser devices with active regions designed for further extending the wavelengths. These include a bilayer GaInAs/GaAsSb structure and a four-period GaAsN/GaAsSb superlattice for extending the emission wavelength of GaInAs/GaAs based QW lasers, and a Ga(In)AsN/GaAsSb type-II multi-QW W-structure for extending the laser wavelengths toward 1.55 μm [Peter et al., Appl. Phys. Lett. 67, 2639 (1995); and Mawst et al., IEEE J. Sel. Top. Quantum Electron. 14, 979 (2008)].

Additional background art includes U.S. Published Application No. 20100072457.

SUMMARY OF THE INVENTION

According to an aspect of some embodiments of the present invention there is provided a method of producing light. The method comprises applying bias to a light emitting system having an active region which comprises a stack of bilayer quantum well structures separated from each other by barrier layers, each bilayer quantum well structure being formed of a first layer made of a first semiconductor alloy for electron confinement and a second layer made of a second semiconductor alloy for hole confinement, wherein a thickness and composition of each layer is such that a characteristic hole confinement energy of the bilayer quantum well structure is at least 200 meV.

According to some embodiments of the invention the bias is applied while the system is at a temperature of about 300K and results in generation of light at a wavelength of from about 1.3 to about 1.55 microns.

According to some embodiments of the invention an individual thickness of each layer in the bilayer quantum well structure is such that characteristic thermal escape lifetimes of electrons and holes out of the bilayer quantum well are within less than 20% from each other.

According to an aspect of some embodiments of the present invention there is provided a method suitable for fabricating a light emitting active region. The method comprises: growing on a substrate a first layer made of a first semiconductor alloy for electron confinement; and growing on the first layer a second layer made of a second semiconductor alloy for hole confinement, thereby forming a bilayer quantum well structure on the substrate; wherein an overall thickness of the bilayer quantum well structure is selected so as to configure a predetermined energy band, and an individual thickness of each layer is selected so as to independently configure a predetermined band offset.

According to some embodiments of the invention the method further comprises growing a barrier layer on the bilayer quantum well structure.

According to some embodiments of the invention the method further comprises: growing a barrier layer on the bilayer quantum well structure, and repeating the growth of the first and the second layers on the barrier layer to form an additional bilayer quantum well structure on the barrier layer.

According to some embodiments of the invention the method further comprises repeating the growth of the barrier layer, the first layer and the second layer at least once to form stack of bilayer quantum well structures separated from each other by barrier layers.

According to some embodiments of the invention an overall thickness of the bilayer quantum well structure is selected to allow generation of light at a wavelength of from about 1.4 to about 1.55 microns at a temperature of about 300K.

According to some embodiments of the invention an individual thickness of each layer in the bilayer quantum well structure is such that characteristic thermionic escape lifetimes of electrons and holes out of the bilayer quantum well are within less than 20% from each other.

According to some embodiments of the invention the first layer comprises $Ga_yIn_{1-y}As_xN_{1-x}$, the y being from about 0.4 to about 0.6 and the x being from about 0.97 to about 0.995, and the layer comprises $GaAs_{1-z-t}Sb_z-tN_t$ the z being from about 0.2 to about 0.3, the t being from about 0.005 to about 0.03.

According to an aspect of some embodiments of the present invention there is provided a light emitting system. The system comprises an active region having a stack of bilayer quantum well structures separated from each other by barrier layers, each bilayer quantum well structure being formed of a first layer made of a first semiconductor alloy for electron confinement and a second layer made of a second semiconductor alloy for hole confinement, wherein a thickness and composition of each layer is such that a characteristic hole confinement energy of the bilayer quantum well structure is at least 200 meV.

According to some embodiments of the invention the stack is on a GaAs substrate.

According to some embodiments of the invention each of the first and the second semiconductor alloys is a III-V semiconductor alloy incorporated with bandgap modifying atoms.

According to some embodiments of the invention the bandgap modifying atoms comprise nitrogen.

According to some embodiments of the invention the bandgap modifying atoms comprise bismuth.

According to some embodiments of the invention an individual thickness of each layer in the bilayer quantum well structure is such that characteristic lifetimes of electrons and holes in the bilayer are within less than 20% from each other.

According to some embodiments of the invention the first layer comprises GaInAsN, and the layer comprises GaAsSbN, wherein a thickness of the second layer is about 50% of a thickness of the first layer, and wherein an overall thickness of the bilayer quantum well structure is less than 2.5 nanometers.

According to some embodiments of the invention the first layer comprises $Ga_yIn_{1-y}As_xN_{1-x}$, the y being from about 0.4 to about 0.6 and the x being from about 0.97 to about 0.995, and the layer comprises $GaAs_{1-z-t}Sb_z-tN_t$ the z being from about 0.2 to about 0.3, the t being from about 0.005 to about 0.03.

According to some embodiments of the invention a thickness and composition of each layer is such that characteristic valence and conduction band offsets of the bilayer quantum well structure are at least 300 meV each.

According to some embodiments of the invention a thickness and composition of each of layer is such that a characteristic electron confinement energy and the characteristic hole confinement energy of the bilayer quantum well structure are within less than 30% from each other.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIG. 1A is a schematic illustration of a superlattice structure, according to some embodiments of the present invention.

Figure 1A:
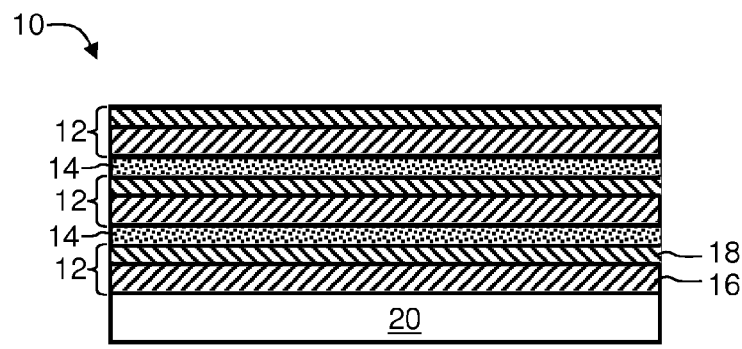
Figure 1B:
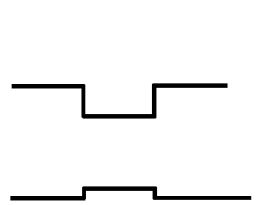
Figure 1C:
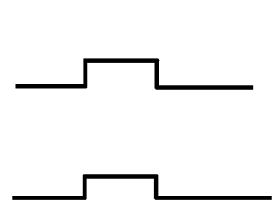
Figure 1D:
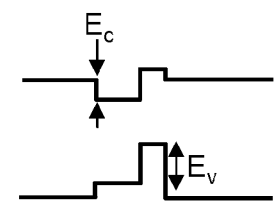

FIGS. 1B-D are schematic illustrations of an electron confinement band diagram (FIG. 1B), hole confinement band diagram (FIG. 1C), and complex band diagram (FIG. 1D).

Figure 2:
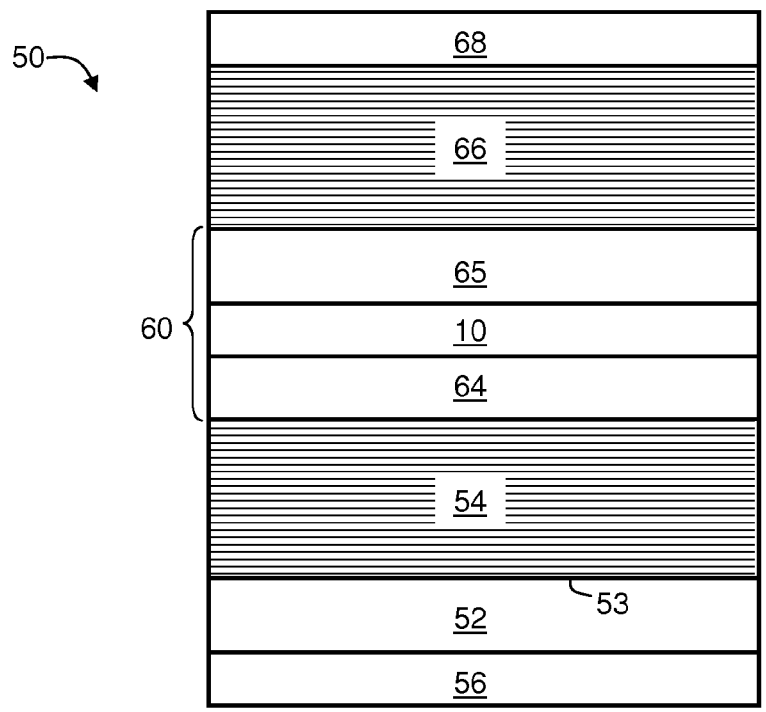
Figure 3:
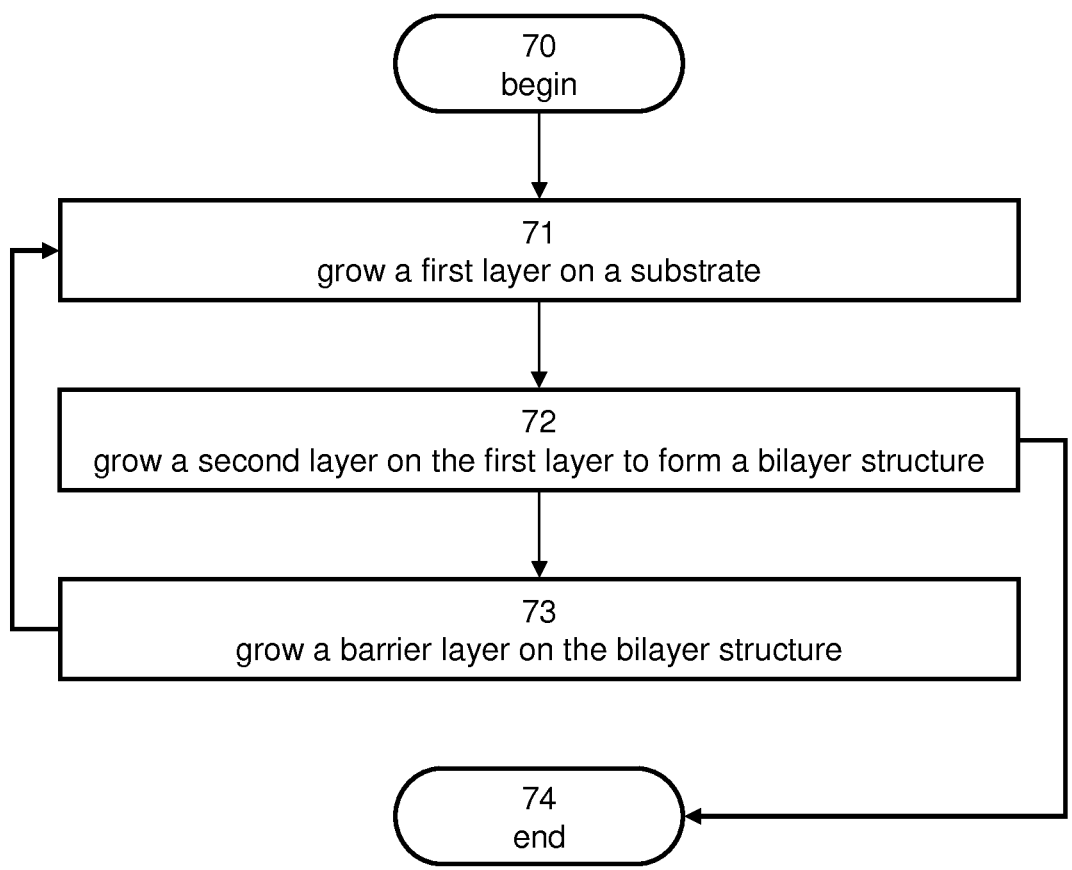

FIG. 2 is a schematic illustration of a light emitting system according to some embodiments of the present invention;

FIG. 3 is a flowchart diagram describing a method suitable for fabricating a single period or a superlattice with two or more periods, according to some embodiments of the present invention.

Figure 4:
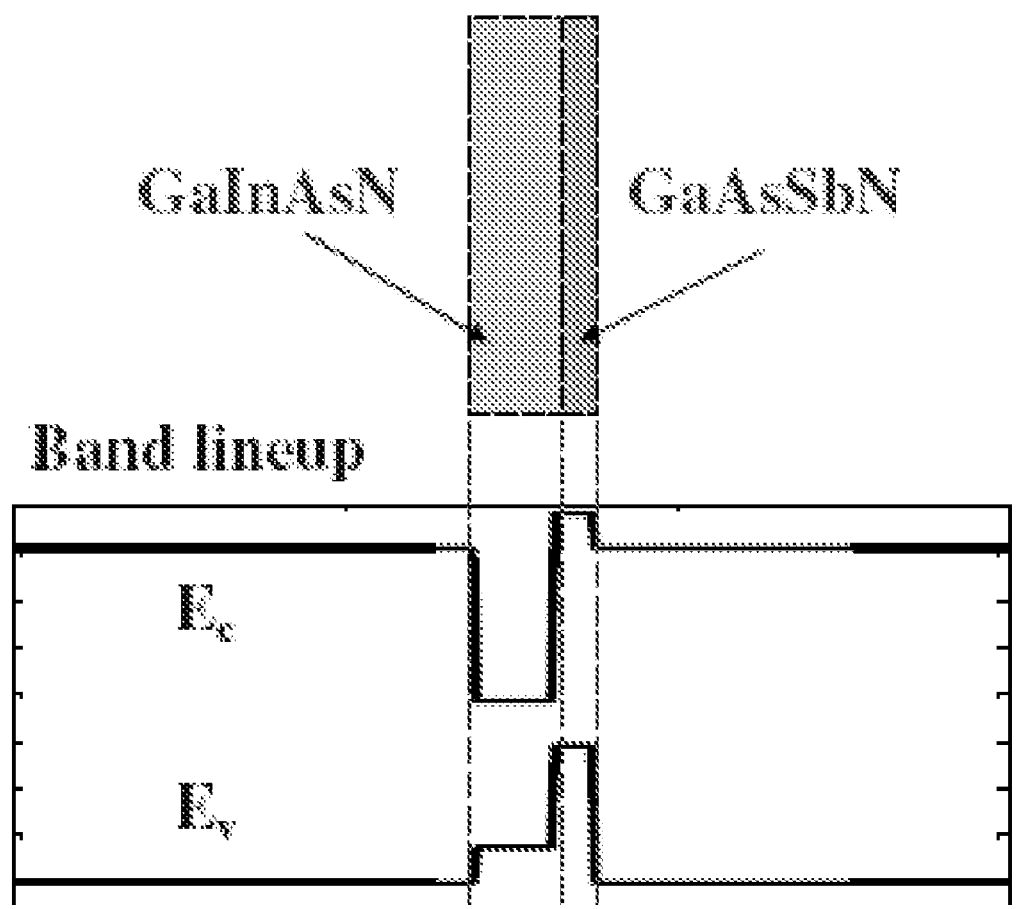
Figures 5A, 5B, 5C, 5D:
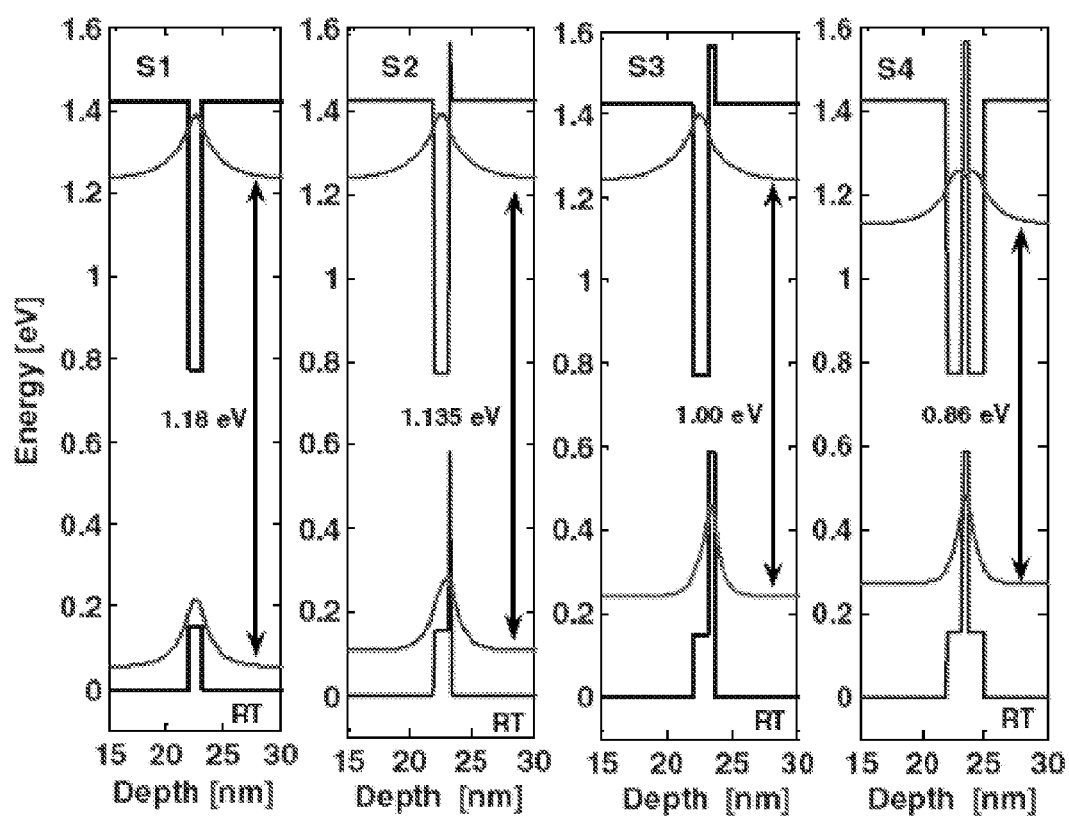

FIG. 4 is a schematic band gap diagram of a bilayer structure having GaInAsN for electron confinement and GaAsSbN for hole confinement, according to some embodiments of the present invention.

FIGS. 5A-D show simulated room temperature energy band diagrams and fundamental hole and electron wave functions (including the first energy level position for holes and electrons shown as the straight horizontal part of the wave functions) for several structures, as obtained in experiments performed in accordance with some embodiments of the present invention.

FIG. 6A shows photoluminescence (PL) spectra at 77 K for several structures, as obtained in experiments performed in accordance with some embodiments of the present invention FIG. 6B shows In, Sb, and N concentration profiles of a GaInAsN—GaAsSbN bilayer structure, as obtained in experiments performed in accordance with some embodiments of the present invention.

FIG. 7A shows schematic band gap structure for a 0.56 nm GaInAsN/GaAs quantum well and calculated effective barrier heights for electrons and holes, as obtained in experiments performed in accordance with some embodiments of the present invention.

FIG. 7B shows schematic band gap of a of a GaInAsN—GaAsSbN bilayer structure and calculated effective barrier heights for electrons and holes, as obtained in experiments performed in accordance with some embodiments of the present invention.

FIGS. 7C-D show integrated PL intensity as a function of the inverse temperature for a GaInAsN/GaAs quantum well structure (FIG. 7C) and a GaInAsN—GaAsSbN bilayer structure (FIG. 7D), as obtained in experiments performed in accordance with some embodiments of the present invention.

FIG. 8A shows electron and hole calculated thermionic escape lifetimes for a GaInAsN—GaAsSbN bilayer structure, and a GaInAsN quantum well reference structure QW, as obtained in experiments performed in accordance with some embodiments of the present invention.

FIG. 8B shows a schematic single-period superlattice (SPSL) band gap structure and calculated e1 to hh1 transition energy and effective barrier heights for electrons and holes, as obtained in experiments performed in accordance with some embodiments of the present invention.

FIG. 8C shows calculated laser gain for the SPSL of FIG. 8B with respect to a reference of equal thickness GaInAs/GaAs quantum well structure, as obtained in experiments performed in accordance with some embodiments of the present invention.

FIG. 9A shows electron and hole thermionic escape lifetimes, for a 1.55 µm SPSL, as calculated in accordance with some embodiments of the present invention.

FIG. 9B shows schematic 1.55 µm SPSL band gap structure, e1 to hh1 transition energy, and effective barrier heights for electrons and holes, as calculated in accordance with some embodiments of the present invention.

FIG. 9C shows 1.55 µm SPSL laser gain with respect to a reference of equal thickness GaInAs/GaAs quantum well structure, as calculated in accordance with some embodiments of the present invention.

DESCRIPTION OF SPECIFIC EMBODIMENTS OF THE INVENTION

The present invention, in some embodiments thereof, relates to light emission and, more particularly, but not exclusively, to the emission of light using a bilayer quantum well structure as an active layer.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

FIG. 1A is a schematic illustration of a superlattice structure 10, according to some embodiments of the present invention. Superlattice 10 can be used in many optical applications. In some embodiments of the present invention superlattice 10 serves or is incorporated in an active region of a light emitting system, such as, but not limited to, a vertical cavity surface emitting laser (VCSEL).

As used herein, a superlattice structure refers to a structure in which one semiconductor is alternately combined (in a periodic manner) with another semiconductor, thus constituting a periodic arrangement of quantum wells. A superlattice is characterized by a conduction band having a base which varies periodically.

A specific type of superlattice structure is a short-period superlattice (SPSL) structure. A SPSL comprises a repetitive sequence of layers, referred to as a period, wherein each period is a quantum well layer and a cap-layer, and the latter serves as the base-layer for the next quantum well layer. This "barrier/well" double-layer repetitive period is known as a short-period.

A quantum well, as used herein, is a semiconductor crystalline structure with size dependent optical and electrical properties. Specifically, a quantum well exhibits quantum confinement effects such that there is a one-dimensional confinement of electron-hole bound pairs or free electrons and holes. The semiconductor structure can have any shape.

A quantum well is typically embodied as a thin layer of a semiconductor compound, where the one-dimensional quantum confinement is along the thickness direction of the layer. The thickness of such layer is typically, but not necessarily, less than about 10 nanometers, e.g., from about 0.2 nanometer to about 3 nanometers, inclusive.

A quantum barrier, as used herein refers to a semiconductor crystalline structure that is next to a quantum well and that creates an energy barrier which imposes confinement and restriction on motion of charge carriers out of the quantum well. Specifically, a quantum barrier is characterized by a discrete energy level. Charge carriers can migrate into the barrier continuum if they are excited to an energy level which is higher than the energy level of the barrier or via quantum tunneling.

Typically, quantum barrier is embodied as a layer of a semiconductor compound, where the relative concentration of the elements forming the compound. Typically, the thickness of the quantum barrier layer is larger than that of the adjacent quantum well. Alternatively, the quantum barrier can be thinner from the quantum well. Still alternatively, the quantum barrier and quantum well can have the same or similar thicknesses. The thickness of a quantum barrier is generally determined from dark current reduction consideration, e.g., reduction of dark current caused by tunneling between fundamental bound states of adjacent well, and reduction of dark current caused by defects. Such considerations are well known to those skilled in the art of quantum well structures.

Typical thickness of a quantum barrier layer suitable for the present embodiments is from about 0.5 to about 5 nm. In some embodiments of the present invention thickness of a quantum barrier layer is less than 1 nm in thickness, e.g., about 0.8 nm.

Other types of quantum wells also exist. For example, B-type quantum wells form a superlattice structure having a "barrier/well-I/well-II" triple-layer period, and so on.

In various exemplary embodiments of the invention superlattice structure 10 is a SPSL structure, however, as will be explained in detail below, each well has a bilayer structure wherein one layer of the bilayer structure serves for confining electrons and the other layer of the bilayer structure serves for confining holes. As will be appreciated by one of ordinary skill in the art, such bilayer structure differs from, for example, a B-type structure, since in B-type structure any two adjacent and physically contacting wells confine the same type of carrier.

Superlattice 10 comprises a stack of bilayer quantum well structures 12 separated from each other by barrier layers 14. Shown in FIG. 1A are three bilayer quantum well structures and two barrier layers, but it is not intended to, limit the scope of the present invention to any specific number of quantum well structures and barrier layers. Each bilayer quantum well structure of the present embodiments is formed of a first layer 16 made of a first semiconductor alloy for electron confinement, and a second layer 18 made of a second semiconductor alloy for hole confinement.

As used herein a "semiconductor alloy for electron confinement" refers to a semiconductor alloy whose band diagram exhibits a well-shape at the conduction band and a barrier-shape at the valence band. A schematic illustration of such band diagram is illustrated in FIG. 1B, showing a type I quantum well that confines electron and holes spatially at the same place, with stronger confinement for electrons and weaker confinement for holes.

As used herein a "semiconductor alloy for hole confinement" refers to a semiconductor alloy whose band diagram exhibits a barrier-shape at the conduction band and a barrier-shape at the valence band. A schematic illustration of such band diagram is illustrated in FIG. 1C.

Thus, the band diagram of bilayer quantum well structure 12 has a complex shape wherein the conduction band has a well-shape adjacent to a barrier-shape, and the valence band has two adjacent barrier-shapes, typically of different heights. A schematic illustration of such complex diagram is illustrated in FIG. 1D.

The layers 16 and 18 and the barrier layers 14 can comprise any semiconductor compound or alloy having a bandgap between a conduction band and a valence band. The semiconductor alloy can be an n-type semiconductor, in which case the majority carriers are electrons and the minority carriers are holes, or a p-type semiconductor, in which case the majority carriers are holes and minority carriers are electrons.

In various exemplary embodiments of the invention the semiconductor compound is a III-V semiconductor alloy, namely an alloy which comprises at least one element from group III of the periodic table and at least one element which comprises V of the periodic table. Exemplary useful group-III elements include, but are not limited to, gallium, indium, thallium and aluminum; and exemplary useful group-V elements include, but are not limited to, arsenic, antimony and phosphorous. The III-V semiconductor alloy of layers 16 and 18 is preferably incorporated with bandgap modifying atoms, such as, but not limited to, nitrogen and bismuth.

Non-limiting examples of III-V semiconductor alloys suitable for layers 16 and 18 include ternary III-V semiconductor alloys such as, but not limited to, InGaAs, InAsSb, GaAsSb, InAsSb, InAsP, AlInAs, AlAsSb, GaAsP and InSbP, InAs, AlInSb, GaInSb, AlGaInP.

Non-limiting examples of III-V semiconductor alloys suitable for barrier layer 14 include binary III-V semiconductor alloys, such as, but not limited to, InAs, InSb, InAs, InP GaSb, GaAs, GaAlAs, and AlSb.

When layers 16 and 18 comprise nitrogen as the bandgap modifying atoms, the corresponding III-V semiconductor alloy can be selected from the group consisting of InAsN, InSbN, InPN, InGaAsN, GaAsSbN, InGaAsSbN, InAsSbN, InAsPN, InSbPN GaSbN, AlInSbN and AlGaInPN.

When layers 16 and 18 comprise bismuth as the bandgap modifying atoms, the corresponding III-V semiconductor alloy can be selected from the group consisting of InAsBi, InAsSbBi, InSbBi, GaSbBi and GaAsSbBi.

In various exemplary embodiments of the invention first layer 16 is made of InGaAsN, second layer 18 is made of GaAsSbN, and barrier layer 14 is made of GaAs. In some embodiments, the specific composition of layer 16 is $Ga_yIn_{1-y}As_xN_{1-x}$, where y is from about 0.4 to about 0.6 (e.g., about 0.5), and x is from about 0.97 to about 0.99 (e.g., about 0.98), inclusive. In some embodiments, the specific composition of layer 18 is $GaAs_{1-z-t}Sb_{z-t}N_t$ where z is from about 0.2 to about 0.3 (e.g., about 0.25), and t, the N content, is from about 0.005 to about 0.03 (e.g., about 0.02), inclusive.

Superlattice 10 is preferably grown on a substrate 20. Layer 16, which physically contact substrate 20 preferably lattice matches substrate 20. Thus, for example, when layer 16 comprises InGaAsN or the like, substrate 20 is GaAs. Other material systems are not excluded from the scope of the present invention.

In various exemplary embodiments of the invention a thickness and composition of each of first 16 and second 18 layer is such that a characteristic hole confinement energy of the bilayer quantum well structure is above 100 meV or above 150 meV or at least 200 meV, or at least 225 meV, or at least 250 meV, or at least 275 meV, or at least 300 meV.

As used herein, "characteristic hole confinement energy" refers to the energy difference between the energy level of the valence band barrier and the ground state energy level of holes in the valence band of the quantum well (highest hole energy level). Specifically, denoting the level of the valence band barrier by $E_v$ (see FIG. 1D) and the ground state energy level of holes by $hh_1$, the term "characteristic hole confinement energy" refers to the difference $E_v-hh_1$.

The term "characteristic electron confinement energy" is defined similarly mutatis mutandis. Specifically, to the characteristic electron confinement energy equals $E_c-e_1$, where $E_c$ is level of the conduction band barrier and $e_1$ is the ground state energy level of electrons in the conductance band of the quantum well (lowest electron energy level).

In some embodiments of the present invention the thickness and composition of each of first 16 and second 18 layer is such that a characteristic electron confinement energy and the characteristic hole confinement energy of the bilayer quantum well structure are within less than 30% or less than 20% or less than 15% or less than 10% or less than 5% from each other.

In some embodiments, both the characteristic valence band offset and characteristic conduction band offset and of bilayer quantum well structure is above 300 meV or above 400 meV or above 500 meV or at least 600 meV.

The thicknesses of layers 16 and 18 affect the first energy level position in the wells. In various exemplary embodiments of the invention layers 16 and 18 are sufficiently thin to support overlap between the electron and hole wave functions while keeping a sufficiently high hole confinement energy.

In some embodiments of the present invention layer 16 has a thickness which is less 2 nm in thickness (e.g., from about 1 nm to about 15 nm, inclusive) and layer 18 has a thickness which is less than 1 nm in thickness (e.g., from about 0.3 nm to about 1 nm, inclusive). Such thin layers provide significant overlap between the electron and holes wave functions, even though the electrons and holes are confined at different quantum wells, and therefore enhances the light emission efficiency (also known as "laser gain" in laser applications).

The individual thickness of each of layers 16 and 18 is preferably selected such that the characteristic thermionic escape lifetimes of electrons and holes in the bilayer 12 are within less than 20% or less than 15% or less than 10% or less than 5% or less than 2% from each other. In a representative and non-limiting example, the thickness of second layer 18 is about 50% of the thickness of first layer 16 wherein an overall thickness of bilayer quantum well structure 12 (without barrier layer 14) is less than 2.5 nanometers or less than 2.0 nanometers. In this embodiment, first layer 16 and second layer 18 comprise, preferably but not necessarily, GaInAsN and GaAsSbN, respectively.

In some embodiments of the invention the characteristic thermal escape lifetimes of the electrons and holes within the respective wells are at least 0.5 ns or at least 1 ns or at least 2 ns or at least 3 ns or at least 4 ns or at least 5 ns. Representative examples of compositions and materials suitable for various band offsets and lifetimes, as well as of suitable techniques for growing such layers, are provided in the Examples section that follows.

It was found by the present inventors that fabrication of bilayer quantum well structures wherein one layer confines holes and the other layer confines electrons is advantageous since it allows to independently control the valence band offset and the conduction band offset (or, equivalently, to independently control the bandgap and the valence band offset; or, equivalently, to independently control the bandgap and the conduction band offset). It was additionally found by the present inventors that such independent control of the energetic environments of the electrons and holes enhances the thermal stability. In some embodiments of the present invention a characteristic photoluminescence intensity of superlattice 10 has a substantially flat (e.g., with a deviation from flatness of less than 10% or less than 5% or less than 1%) temperature dependence at low temperature (e.g., less than 100 K).

For higher temperature, for example, above 200K (e.g., from about 200K to about 300K) the activation energy required for removing a hole out of the quantum well is at least 100 meV or at least 120 meV or at least 140 meV or at least 160 meV. The activation energy can be extracted from the slope of the non flat part of the photoluminescence intensity temperature dependence. A procedure for extracting the activation energy is described in the Examples section that follows.

High activation energy and/or sufficiently high band offsets are particularly useful when superlattice 10 is used or incorporated in a light emitting system that generates light at long wavelengths suitable for optical communications (e.g., from about 1.3 μm to about 1.55 μm, inclusive). Thus, in various exemplary embodiments of the invention superlattice 10 is configured to emit light, in response to electrical or optical pumping, at a wavelength of from about 1.3 μm to about 1.55 μm, inclusive. Other wavelengths are not excluded from the scope of the present invention.

FIG. 2 is a schematic illustration of a light emitting system 50 according to some embodiments of the present invention.

System 50 is illustrated in FIG. 50 as a VCSEL system, but other types of light emitting systems (e.g., edge-emitting laser systems) are not excluded from the scope of the present invention.

System 50 is formed on a substrate 52, which may be GaAs or any other semiconductor substrate, preferably but not necessarily, a III-V semiconductor substrate. Substrate 52 has an upper surface 53 on which a first light reflector 54 is disposed, so as to reflect light generated by an active region 60 disposed on light reflector 54.

Light reflector 54 can include, for example, a stack of mirror pairs in a GaAs/Al GaAs material system or any other material system. Light reflector 54 is typically formed by epitaxial growth of pairs of layers on substrate 52. Preferably, light reflector 54 lattice matches substrate 52. Thus, for example, when substrate 52 is GaAs and light reflector 54 can comprise pairs made of the GaAs/Al(Ga)As material system. Other material systems are not excluded from the scope of the present invention. Alternatively or additionally, light reflector can comprise a photonic crystal layer as known in the art (see, for example, the photonic crystal layer described in U.S. Pat. No. 7,689,483, the contents of which are hereby incorporated by reference).

Active region 60 comprises superlattice 10 as further detailed hereinabove, and may also include other layers as known in the art. Optionally and preferably a second light reflector 66 is disposed on second active region 60. Second light reflector 66 can be, for example, similar or identical to first light reflector 54.

In some embodiments of the present invention active region 60 also comprises a first cladding region 64 adjacent light reflector 54 and a second cladding region 65 adjacent light reflector 66, such that superlattice 10 is sandwiched between cladding region 64 and cladding region 65.

Cladding region 64 preferably comprises one or more layers which may be graded if desired to lattice match light reflector 54 to superlattice 10. For example, when superlattice 10 is based on GaInAsN—GaAsSb bilayer quantum well structures, cladding region 64 can be formed of a GaAs material system. In some embodiments of the present invention cladding region 64 can include a layer that lattice match light reflector 54 adjacent to light reflector 54, and a layer formed of a material having a gradient to lattice match superlattice 10, adjacent to superlattice 10.

Cladding region 65 preferably comprises one or more layers which may be graded if desired to lattice match light reflector 66 to superlattice 10. For example, when superlattice 10 is based on GaInAsN—GaAsSb bilayer quantum well structures, cladding region 64 can be formed of a GaAs material system. In some embodiments of the present invention cladding region 65 comprises a layer that lattice match light reflector 66 adjacent to light reflector 66, and a layer formed of a material having a gradient to lattice match superlattice 10 adjacent to superlattice 10.

Active region 60 and light reflectors 54 and 66 are preferably configured to emit light with a wavelength in a range of approximately 1.3-1.55 micrometers.

To complete system 50, a contact layer 68 is optionally and preferably positioned on light reflector 66, and a contact layer 56 is positioned on substrate 52, for example on the rear surface thereof. As will be understood by those skilled in the art contact layer 68 is so constructed as to permit the emission of light from system 50. In some embodiments of the present invention system 50 also comprises a current blocking layer (not shown) above or below the active region 60, as known in the art.

In use, bias is applied to active region 60 (e.g., by connecting contacts layers 56 and 68 to a voltage source, not shown), and light is generated within the active layer superlattice 10 and emitted, for example, through layer 65.

Reference is now made to FIG. 3 which is a flowchart diagram describing a method suitable for fabricating a light-emitting active layer composed of a single period or a super-lattice with two or more periods, according to some embodiments of the present invention. The method is particularly useful for fabricating at least a portion of superlattice 10 described above. It is to be understood that, some of the operations described below are optional and may not be executed.

The method begins at 70 and continues to 71 at which a first layer made of a first semiconductor alloy for electron confinement is grown on a substrate. In some embodiments of the present invention 71 includes growing layer 16 on substrate 20. The method continues to 72 at which a second layer made of a second semiconductor alloy for hole confinement is grown on the first layer, thereby forming a bilayer quantum well structure on the substrate. In some embodiments of the present invention 72 includes growing layer 18.

In various exemplary embodiments of the invention an overall thickness of the bilayer quantum well structure is selected so as to configure a predetermined energy band, and an individual thickness of each layer is selected so as to independently configure a predetermined characteristic hole confinement energy. The predetermined energy band preferably corresponds to emission of photons at a wavelength of from about 1 µm to about 1.2 µm (e.g., 1.15 µm), inclusive. Other energy bands are not excluded from the scope of the present invention. When it is desired to emit photons at higher wavelengths, two or more periods are grown, as further detailed hereinbelow.

The predetermined characteristic hole confinement energy is preferably above 100 meV or above 150 meV or at least 200 meV, or at least 225 meV, or at least 250 meV, or at least 275 meV, or at least 300 meV for the valence band. In some embodiments, both the characteristic valence band offset and characteristic conduction band offset are above 100 meV or above 150 meV or at least 200 meV, or at least 225 meV, or at least 250 meV, or at least 275 meV, or at least 300 meV.

The growth of the two layers can be performed using any procedure known in the art. Typically when using MOCVD, the first layer is grown using a atomic layer epitaxy (ALE), such as, but not limited to, the ALE technique described in U.S. Published Application No. 2010 0301306, the contents of which are hereby incorporated by reference. A representative example of an ALE technique suitable for the present embodiments is described in the Examples section that follows. The advantage of using ALE in the first layer is that it facilitates better incorporation of the bandgap modifying atoms. The second layer can also be grown by ALE, but it can also be grown by other techniques, including, without limitation, chemical vapor deposition CVD, e.g., metal organic CVD (MOCVD), or Molecular Beam Epitaxy (MBE) or metal organic MBE. In some embodiments of the present invention the first layer is grown by ALE and the second layer is grown by a technique other than ALE.

Optionally and preferably the method proceeds to 73 at which a barrier layer is grown on the bilayer quantum well structure, e.g., on the second layer thereof. The barrier layer can be barrier layer 14 as further detailed hereinabove. When it is desired to fabricate more than one period, the method preferably loops back to 71 so as to grow another bilayer quantum well structure on the previously formed bilayer structure so as to form a superlattice having a plurality of periods. In various exemplary embodiments of the invention the number of periods is selected so as to configure a predetermined energy band. The predetermined energy band preferably corresponds to emission of photons at a wavelength of from about 1.3 µm to about 1.55 µm, inclusive. Other energy bands are not excluded from the scope of the present invention.

Once the upper most (in the growth direction) bilayer structure is grown, it is not necessary to grow on it an additional barrier layer. Thus, the growth of final period can be terminated after the second layer of this period has been grown. Yet, embodiments in which a barrier layer is grown on the topmost bilayer structure are note excluded from the scope of the present invention.

As used herein the term "about" refers to ±10%.

The word "exemplary" is used herein to mean "serving as an example, instance or illustration." Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments." Any particular embodiment of the invention may include a plurality of "optional" features unless such features conflict.

The terms "comprises", "comprising", "includes", "including", "having" and their conjugates mean "including but not limited to".

The term "consisting of means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

Example 1

GaInAsN—GaAsSbN Superlattice

Thin GaInAsN—GaAsSbN bilayer structures were fabricated in accordance with some embodiments of the present invention. The structures were grown on semi-insulating (001)-oriented GaAs substrates using a low-pressure MOCVD upside-down vertical reactor. The 1000 Å GaAs buffer and cap layers were grown at 650° C., and the bilayers were grown at 500° C. Trimethylgallium and trimethylindium were used as the group III sources, $AsH_3$, trimethylantimony and dimethylhydrazine were used as the group V sources, and $H_2$ was used as the carrier gas. The first component of the bilayer, a 12 Å thick $Ga_{0.5}In_{0.5}As_{0.9845}N_{0.0155}$ layer, having lattice mismatch of 0.0327 (Table 1), was grown by atomic layer epitaxy (ALE) as described in U.S. Published Application No. 2010 0301306, with alternate exposure to group-III and group-V column sources with the sequence (Ga—N—In—N—In—N—Ga—As).

TABLE 1

| Layer | Lattice constant a (Å) | Lattice mismatch (on GaAs) | Strain (on GaAs) |
|---|---|---|---|
| $Ga_{0.5}In_{0.5}As_{0.9845}N_{0.0155}$ (12 Å) | 5.8387 | 0.0327 | −0.0318 |
| $GaAs_{0.733}Sb_{0.26}N_{0.007}$ (6 Å) | 5.7604 | 0.0189 | −0.0186 |
| 3x bilayer structure (70 Å) | 5.7761 | 0.0214 | −0.0213 |
| $Ga_{0.7}In_{0.3}As$ | 5.7748 | 0.0214 | −0.0210 |
| GaAs (8 Å) | 5.6533 | 0 | 0 |

The grown QW was compared with ALE-grown InAs QW, where the N atomic layers (ALs) were replaced by As ALs. The red-shift in the photoluminescence (PL) spectra of the two QWs enables the calculation of incorporation of N. The PL spectra of the grown layer is red-shifted by 130 meV with respect to the InAs reference QW's PL (an average of 43 meV shift per N AL).

The second component of the bilayer, $GaAs_{0.733}Sb_{0.26}N_{0.007}$, having lattice mismatch of 0.0189 was grown by MOCVD with a V/III ratio of 0.8 and a growth rate of 0.13 Å/s. The composition and the growth rate of this layer were found by characterizing thick GaAsSbN/GaAs QWs using PL, x-ray diffraction, time-of-flight secondary ion mass spectrometry (TOF-SIMS) and transmission electron microscopy.

These components were used to form the following structures.

Structure S1: $Ga_{0.5}In_{0.5}As_{0.9845}N_{0.0155}$, ALE-grown, about 12 Å thick QW layer;

Structure S2: GaInAsN—GaAsSbN thin bilayers grown with the same $Ga_{0.5}In_{0.5}As_{0.9845}N_{0.0155}$ layer followed by the growth of about 2 Å-thick $GaAs_{0.733}Sb_{0.26}N_{0.007}$ layer, with total thickness of about 14 Å;

Structure S3: GaInAsN—GaAsSbN thin bilayers grown with the same $Ga_{0.5}In_{0.5}As_{0.9845}N_{0.0155}$ layer followed by the growth of about 6 Å-thick $GaAs_{0.733}Sb_{0.26}N_{0.007}$ layers, with total thickness of about 18 Å;

Structure S4: W-shape structure of a 30 Å thick GaInAsN—GaAsSbN—GaInAsN formed by the growth of about 12 Å $Ga_{0.5}In_{0.5}As_{0.9845}N_{0.0155}$ on top of structure S3.

All QWs structures were confined by GaAs barriers. A schematic energy band diagram of the type II GaInAsN—GaAsSbN bilayer structure is presented in FIG. 4. Schematic energy band diagrams of structure S1, S2, S3, S4 are shown in FIGS. 5A-D The above samples were characterized using PL and TOF-SIMS. PL measurements were conducted at 77 K using a photomultiplier tube or a cooled germanium detector with 10 mW HeNe laser as excitation source. PL analysis was achieved using a conventional single-band envelope function model based on empirical data of band gap, effective mass and energy lineup dependence on N and In composition [see for example, Buchinsky et al., IEEE J. Quantum Electron. 34, 1690 (1998) and Albo et al., Appl. Phys. Lett. 94, 093503 (2009) and references therein].

The simulated energy band diagrams and fundamental electron and hole wave functions of the grown structures S1-S4 are presented in FIG. 5. Temperature-dependent PL was conducted with a focused 5 mW HeNe laser as an excitation source and a nitrogen cooled InGaAs charge coupled device detector. The TOF-SIMS results were recorded with an ION-TOF TOF.SIMS5 spectrometer in the dual beam analysis mode. The nitrogen concentration was calibrated using an ion-implanted standard.

The 77 K PL spectra of the four grown samples are shown in FIG. 6A. The PL intensity emitted from sample S1 is comparable to that of a standard GaInAs/GaAs QW.17 The 60 meV PL linewidth is mainly due to the high alloy disorder. Samples S2 and S3 have a similar PL linewidth but reduced PL intensity by factors of about 9 and about 4.5, respectively.

The reduced intensity of sample S2 as compared with S3 was attributed to the less-than-one full monolayer coverage of GaAsSbN. The GaAsSbN film thickness was calculated from the PL wavelength redshift from 981 to 1014 nm on this sample as compared with S1. Sample S3 shows additional PL wavelength red-shift to 1150 nm due to the increased GaAsSbN layer thickness to about 6 Å, which is approximately two full monolayers, resulting in a high quality (depicted by the relatively high PL intensity) thin bilayer structure.

The thickness of the GaAsSbN layer grown on top of GaInAsN was linearly dependent on growth time but the growth rate was reduced by a factor of 3 as compared with the growth on GaAs. The reduction in growth rate was attributed by the present inventors to the high strain in the grown layer. This is confirmed by the observation that when trying to grow a full AL on top of a strongly strained layer, the result is the growth of less-than a full AL accompanied by reduced PL intensity. Adding a second GaInAsN layer on top of a bilayer structure (structure S3) to form a W-shaped structure (structure S4) reduces the PL intensity by a factor of about 53 as compared with structure S1, and results in smaller than expected PL wavelength redshift and an increase in linewidth to 113 meV.

These findings indicate that a reduction in material quality resulted from the high strain, due to high In content (50%), when approaching critical thickness. The present inventors concluded that the W-structure of structure S4 was inferior as an active region of QW laser, and the bilayer structure S3 is more suitable to form a SPSL that supplies longer wavelength, as will be explained later, and is thick enough to be used as a laser active region.

The TOF-SIMS profile of the bilayer structure is shown in FIG. 6B. The bilayer structure width is smaller than the TOF-SIMS resolution limit, yet it confirms the presence of all the elements and it is clearly noticeable that the leading edge of the N distribution appears ahead of the leading edge of the Sb distribution.

The temperature dependence of the PL intensity was used to compare the bilayer QW of the present embodiments with a similar band gap, high quality 56 Å thick $Ga_{0.75}In_{0.25}As_{0.98}N_{0.02}/GaAs$ QW (referred to as structure S5). FIGS. 7A and 7B show the band gap structures of structures S5 and S3. The energy levels and wave functions of the confined conduction band electrons and valence band holes were calculated, as described in Buchinsky et al., and Albo et al., supra. The height of the flat base of the wave functions represents the calculated energy levels for S5 and S3 at 300 K. The temperature dependence of the integrated PL intensity of each QW is depicted as an Arrhenius plot in FIGS. 7C and 7D. As shown, the PL intensity from the bilayer structure S3 is higher than that of the single QW S5 at all temperatures. To quantify the quenching of the luminescence at high temperatures, the following model was adopted [Botha et al., Phys Rev B 50(24), 18147 (1994)]:

$$I = \frac{P}{\left[1 + \frac{R'}{U}\right]\left[1 + \frac{U_1}{R}\exp(-E_1/k_BT)\right] + \frac{R'}{R}\exp(-E_a/k_BT)} \quad (EQ.\ 1)$$

where I is the PL intensity, R is the radiative recombination rate in the well, and R' is the non-radiative recombination rate in the barriers. The constant excitation rate in the barriers is denoted by P. The pairs trapping rate into the well is denoted by U and the de-trapping rate of pairs from the well is U $\exp(-E_a/k_BT)$, where $E_a$ is the difference in energy between the barrier and QW luminescence (the activation energy for a electron-hole pair). The trapping rate and de-trapping rate of the less confined carrier type from the well is given by $U_1$ and $U_1 \exp(-E_1/k_BT)$ respectively, where $E_1$ denotes the confinement energy of the carrier. Assuming the following temperature dependence for the rate constants in Eq. (1) $R \propto T^{-1}$, $U=R' \propto T$ and $U_1 \propto T$, the theoretical equation describes the experimental data, obtained for GaInAs/GaAs QWs [Botha et al., supra]. For GaInAsN/GaAs QWs, due to the smaller exciton biding energy, the thermalization of holes to the barriers rather than electrons-hole pair responsible for the PL quenching mechanism. In this case U, and U $\exp(-E_a/k_BT)$, are due to the less confined carriers rather than of the electron-hole pairs, were $E_a$ refer to the energy of this carrier given by the energetic distance of the first confined level from the barrier edge. $U_1$ and $U_1 \exp(-E_1/k_BT)$ are due to excitation of exitons from localized states to extended QW states, where $E_1$ denotes their average confinement energy.

Returning to FIG. 7C, the dashed lines represent the best fit of Eq. (1) to experimental data, using the temperature dependences of the rate constants as stated above for the single QW (structure S5). A different temperature dependence of the rate constants affects $E_1$ but has almost no effect on $E_a$. The present inventors found that the fitting in the intermediate-temperature range for the bilayer QW (structure S3) in FIG. 7D is very sensitive to the temperature variation in the $U_1/R$ rate constant, and the best fit was achieved for the temperature-independent coefficient.

In this example, the analysis is mainly on the high temperature range where the thermal activation energy $E_a$ is nearly independent of the exciton confinement depth $E_1$ and intermediate-temperature rate constants.

The results of the fitting show that the $E_a$ values are about 67 and about 165 meV for the GaInAsN QW (structure S5) and bilayer QW (structure S3), respectively. A plausible explanation for the PL quenching at high temperature is the thermalization of free carriers (electrons or holes) followed by defect-related nonradiative recombination. This is confirmed by the fact that the $E_a$ value for single GaInAsN QW is in the range of the calculated holes confinement energy in this structure (59 meV), as shown in FIG. 7A, and the $E_a$ value for the bilayer QW is close to the confinement depth of an electron in this structure (183 meV, FIG. 4B). Without wishing to be bound to any theory it is interpreted that high-temperature PL quenching occurs because of free carriers indicates that in the bilayer structure, electrons rather than holes are the less confined carrier. This result also confirms that the bilayer of the present embodiments provides a better confinement of holes compared with conventional GaInAsN/GaAs QW.

The lifetime of the different carriers before escaping to the barriers of the two structures, S3 and S5 was also calculated. The thermionic current leakage from the edge of the QW to one side of the barrier, $J_{ee\_i}$, is given by:

$$J_{ee\_i} = \frac{4\pi q (k_B T)^2}{h^3} m_i^* \exp\left(\frac{E_{bi} - F_i}{k_B T}\right) \quad (2)$$

where $m_i^*$, $E_{bi}$ and $F_i$ are the effective masses of the specific carrier (holes or electrons) in the QW, the effective barrier height, and the quasi-Fermi level, respectively, and $k_B$ and h are the Boltzmann and Planck constants, respectively.

The thermionic current $J_{ee\_i}$ relation to the thermionic emission carrier lifetime to one side of the barrier, $\tau_{ee\_i}$ is:

$$J_{ee\_i} = \frac{NqL_z N_{QW}}{\tau_{ee\_i}} \quad (3)$$

where i, N, q, $L_z$, and $N_{QW}$, represent the type of carriers, the number of QWs, the electron charge, the QW thickness, and the carrier density in the QW respectively.

FIG. 8A shows the results of the calculation of the lifetime versus carrier concentration in the QW, calculated for the two types of carrier in both structures. The value used for the effective mass of the electrons was $0.1\ m_0$ for both structures, and for the holes, the effective mass values used were $0.44\ m_0$ for S5 and $0.42\ m_0$ for S3. The effective barrier heights were taken from the calculations displayed in FIGS. 7A and 7B. The lifetimes were 0.5 ps and 485 ns for the holes and electrons, respectively, for the GaIn—AsN QW at 300 K and the carrier density was $4\times10^{18}$ cm$^{-3}$, indicating that the hole leakage mechanism is dominant. The calculated lifetime of 236 and 62 ps of holes and electrons in the bilayer structure indicates the dominance of the electron leakage mechanism because the effective barrier for holes is much higher, as shown in FIGS. 7A and 7B. In fact, the holes' lifetime is increased beyond that of electrons whereas equal values are the favorable situation, demonstrating the advantage of independent control of the band offsets.

For the bilayer structure, band offset control can be done by increasing the thickness of the GaInAsN component at the expense of the GaAsSbN component. For example, instead of 12 Å GaInAsN/6 Å GaAsSbN, a 14 Å GaInAsN/4 Å GaAsSbN can be grown keeping the total thickness constant so that the emitted wavelength stays the same. This increases the electrons confinement energy from 183 to 229 meV and reduce the holes confinement energy from 242 to 175 meV. Thus, the holes and electrons calculated lifetimes are 18 ps and 363 ps, respectively, demonstrating the ability to control the band offsets independently.

The bilayer structure of the present embodiments can be used as a building block for SPSL which provided both extension of the wavelength and a high-gain active layer, and separate band offsets control.

The reduced PL intensity of structure S4 indicates excessive strain that affects the quality, yet the structure thickness can be increased to obtain longer wavelength by incorporating an 8 Å GaAs spacer between three bilayers, to form a 70 Å thick SPSL. The structure's total strain is equivalent to a single QW containing 30% In with the same thickness, which is below the critical thickness (about 110 Å), as estimated from the averaged lattice constant, Table 1. The energy levels and wave functions of the confined electrons, holes and the gain of this SPSL were calculated, as described in Buchinsky et al. supra. FIG. 8B shows the band structure and the fundamental transition (electrons-heavy holes) of the SPSL of the present embodiments. The calculated values for emission wavelength and effective barriers were 0.89 eV at 300 (about 1.4 μm) and 258 and 275 meV for electrons and holes respectively. The electron and holes thermionic emission lifetimes obtained from the calculation above were about 1.2 ns for holes and about 1.1 ns for the electrons at 300 K at a carrier density of $4\times10^{18}$ cm$^{-3}$, indicating significant increase in the current injection efficiency.

The SPSL's calculated gain versus the injection current is shown in FIG. 8C and is compared with the gain of GaInAs QW with the same thickness and In composition. The transparency obtained at a similar carrier density of about $1\times10^{18}$ cm$^{-3}$, and the calculated gain at about $4\times10^{18}$ cm$^{-3}$ was about 87% of that of the GaInAs QW.

A similar SPSL structure can be constructed according to some embodiments of the present invention for wavelength of 1.55 μm (0.8 meV). The thicknesses of bilayer components with the concentrations are presented in Table 2.

TABLE 2

| Layer | Lattice constant a (Å) | Lattice mismatch (on GaAs) | Strain (on GaAs) |
|---|---|---|---|
| Ga$_{0.5}$In$_{0.5}$As$_{0.98}$N$_{0.02}$ (12 Å) | 5.8337 | 0.0319 | −0.0309 |
| GaAs$_{0.77}$Sb$_{0.32}$N$_{0.01}$ (6 Å) | 5.7836 | 0.0230 | −0.0225 |
| 3x bilayer structure (70 Å) | 5.7795 | 0.0223 | −0.0218 |
| GaIn$_{0.3}$As | 5.7748 | 0.0214 | −0.0210 |
| GaAs (8 Å) | 5.6533 | 0 | 0 |

The extra nitrogen percentage in the GaInAsN component can be obtained by reducing the ALE growth temperature. Further reduction in strain, without affecting significantly the band structure, can be achieved by adding extra nitrogen to the GaAsSbN bilayer component.

FIG. 9B shows the band structure and the fundamental transition (electrons-heavy holes) of the 1.55 μm SPSL. The calculated values for emission wavelength and effective barriers heights were 1.55 μm (0.8 eV) at 300 K and 321 and 306 meV for electrons and holes, respectively. The electron and holes thermionic emission lifetimes obtained from the calculation above were about 6.9 ns for holes and about 7.1 ns for the electrons at 300 K at a carrier density of about $4\times10^{18}$ cm$^{-3}$ as shown in FIG. 9A, indicating significant increase in the current injection efficiency. The SPSL's calculated gain versus the injection current is shown in FIG. 9C and is compared with the gain of GaInAs QW with the same thickness and In composition. The transparency obtained at a similar carrier densities of about $1\times10^{18}$ cm$^{-3}$, and the calculated gain at $4\times10^{18}$ cm$^{-1}$ was about 80% of that of the GaInAs QW.

Example 2

Atomic Layer Epitaxy

Currently used methods for preparing high-indium content and about 2% nitrogen content quantum wells rely on lowering the temperature of the substrate, however, while low temperatures assist in increasing the nitrogen content, the crystallinity and optical characteristics of the layers decreases and so is the quality of the resulting structure. This limitation is even greater when the deposition is effected by organometallic sources (MOCVD).

Since superlattice structures based on gallium arsenide and indium arsenide are characterized by high degree of strain, leading to reduced crystallinity and lower quality of the resulting quantum wells and superlattice structures, the present inventors recognized a need for a process which can afford large and well ordered high-indium content quantum wells and superlattice structures which would exhibit an improved performance as compared to currently produced superlattices.

The present inventors have realized that the benefits of the ALE monolayer growth process can be harnessed to overcome the main impediments of nitrogen incorporation during growth of large and well-ordered superlattice structures, particularly those of high-indium content.

While reducing the present invention to practice, the present inventors have demonstrated the production of high-indium content InAsN quantum wells, while using the ALE process. Moreover, the present inventors have surprisingly uncovered that lowering the working temperatures during the ALE process presented herein while exposing the growing layers to nitrogen, does not reduce the crystal quality of the resulting structure, and that sharp interfaces and uniform conformal layers are obtained with high level of controllability over the thickness of the periodic layers of the superlattice structure and the amount of nitrogen incorporated therein.

Following is a description of a process of forming a quantum well structure which includes a base-layer and a well-layer, wherein the well-layer, as defined hereinbelow, includes a group-III element, a group-V element and nitrogen. One of ordinary skills in the art, provided with the details described herein would know how to adjust the process of the present invention for other semiconductor alloys and/or other bandgap modifying atoms, including, without limitation, bismuth and oxygen.

For simplicity purposes, herein throughout, a nitride-type well-layer is described as a well layer that comprises nitrogen.

The process, which is typically performed in a sealed reaction chamber, is effected by:

(a) epitaxially growing the base-layer on a substrate or a platform;

(b) epitaxially growing the well-layer on the base-layer; and (c) growing the cap-layer on the well-layer;

thereby forming the quantum well structure.

According to embodiments of the invention, epitaxially growing the well-layer is effected by atomic layer epitaxy (ALE), namely:

(i) exposing the base-layer to a precursor of a group-III element, to thereby form, on the base-layer, a first atomic layer composed of atoms of a group-III element deposited thereon;

(ii) terminating the exposure to the group-III element precursor;

(iii) exposing the base-layer having the first atomic layer to a precursor of nitrogen, to thereby form the base-layer having the first atomic layer deposited thereon and atoms of nitrogen absorbed onto the first atomic later;

(iv) terminating the exposure to the nitrogen precursor;

(v) exposing the base-layer to a precursor of a group-III element, to thereby form on the base-layer a second atomic layer of atoms of a group-III element;

(vi) terminating the exposure to the group-III element precursor; and (vii) exposing the base-layer having the first atomic layer, nitrogen and the second atomic layer deposited thereon, to a precursor of the group-V element.

As used herein, the term "well-layer" refers to the inner layer in a quantum well structure, as opposed to the two flanking barrier-layers, as these terms are known in the art.

By "epitaxially growing" with respect to the base-layer or the cap-layer it is meant that the base-layer and the cap-layer (any barrier layer according to some embodiments of the present invention) can be formed by any conventional epitaxy method, such as, for example, solid phase epitaxy (SPE), vapor phase epitaxy (VPE), hot-wall epitaxy (HWE), chemical vapor deposition (CVD), molecular beam epitaxy (MBE) or metal organic chemical vapor deposition (MOCVD), wherein all the layer elements are introduced essentially at once, as opposed to the manner by which layer elements are introduction using atomic layer epitaxy (ALE).

The base- and cap-layers can be formed of various chemical compositions. The chemical composition of the base layer and the cap layer can be the same or different.

Suitable substances for forming the base layer and/or the cap layer include, but are not limited to, GaAs, GaAsSb, GaAsSbN, AlGaAs, GaAsP, GaSb, GaSbN and GaInAs, including combinations thereof, nitrides, oxides and the likes.

In some embodiments, a base layer comprises GaAs. In some embodiments, base layer which comprises GaAs is formed by conventional MOCVD.

In some embodiments, a cap layer comprises GaAs. In some embodiments, a cap layer which comprises GaAs is formed by conventional MOCVD.

In some embodiments, a cap layer comprises GaAsSb. In some embodiments, a cap layer which comprises GaAsSbN is formed by conventional growth techniques.

Regardless of the method by which the barrier-layers (the base layer and the cap layer) are formed, and the substance(s) constituting same, the nitride-containing well-layer, according to some embodiments of the present invention, is formed by atomic layer epitaxy, wherein each precursor of each of the elements is introduced into the reaction chamber individually, while no other precursor is introduced concomitantly. Accordingly, in the process described herein, a precursor of one substance is introduced to the reaction chamber after terminating the exposure to the previous substance (e.g., by cutting-off the supply of the previous precursor to the reaction chamber).

The optical and electronic properties of the quantum wells, prepared by the process presented herein, are influenced by the selection of certain elements to form the various layers.

A chemical substance, referred to herein as a precursor, is used as a source of each element.

Exemplary precursors of nitrogen include, but are not limited to, dimethylhydrazine (DMH), ammonia, hydrazine, monomethylhydrazine, t-butylhydrazine, phenylhydrazine, t-butylamine and nitrogen trifluoride.

Exemplary precursors of gallium include, but are not limited to, trimethylgallium ($Ga(CH_3)_3$), diethyl gallium chloride ($Et_2GaCl$) and the likes as known in the art.

An exemplary precursor of indium includes, but is not limited to, trimethylindium ($In(CH_3)_3$).

Exemplary precursors of arsenic include, but are not limited to, arsine ($AsH_3$), t-butylarsine ($(t-Bu)AsH_2$) and tri-t-butylarsine.

Other group-V element precursors include $PH_3$, $(t-Bu)PH_2$, $(CH_3)_3Sb$, $(CH_3)_3Bi$ and the likes.

It would be appreciated that a person skilled in the art would readily select suitable other precursors for the Group-III element, group-V element and nitrogen, as described herein. Such other precursors are contemplated herein.

The well-layer that contains group-III/V elements and nitrogen is formed by exposing the base-layer at least twice to the group-III element, introducing nitrogen between group-III element exposures, and at least once to the group-V element. The group-III element can be the same in each exposure, or different.

Other combinations of group-III/V elements are possible when forming the well-layer according to some embodiments of the present invention, such that would afford various combinations of elements. Non-limiting examples of group-III/V elements combinations include binary III/V indium-containing semiconductor alloys such as InAs, InSb, InP and InBi, and ternary III/V indium-containing semiconductors alloys such as InAsGa, InAsSb, InAsBi, InSbBi, InAsP and InSbP.

According to some embodiments of the present invention, a dilute nitride can be formed with any of the aforementioned group-III/V elements combinations and others, all being contemplated herein.

At the final stage of the epitaxial reaction, the well-layer is characterized by a unique chemical composition based on the presence of the group-III element, the group-V element and nitrogen, and particularly based on the relative ratio therebetween.

According to some embodiments of the present invention, the number of atoms of the group-III element in the well-layer prepared by the process presented herein is at least 50 percents of the total number of atoms of the well-layer. Such a high ratio of group-III element atoms, which is necessary for most quantum well applications, is also one of the reasons behind the difficulties in incorporating nitrogen atoms into the well-layer; however, these difficulties are obviated by the process presented herein.

In some embodiments, the number of atoms of the group-III element in the well-layer is 50 percents, 55 percents, 60 percents, 65 percents, 70 percents, 75 percents or even 80 percents, of the total number of atoms of the well-layer. Any number between these values is also contemplated.

According to some embodiments of the present invention, the number of nitrogen atoms ranges from 0.1 to 5 percent of the total number of atoms of the well-layer. Such a relative high number of nitrogen atoms enables to produce the dilute nitride effect discussed hereinabove in the quantum well resulting from the process presented herein.

In some embodiments, the number of nitrogen atoms ranges is 0.1 percent. 0.2 percent, 0.5 percent, 1 percent, 1.2 percent, 1.5 percent, 1.7 percent, 2 percents, 2.5 percent or 3 percents, of the total number of atoms of the well-layer. Any number between these values is also contemplated.

A perfect lattice can be defined fully by the lattice constants, namely the constant distance between the repetitive units in the lattice. A lattice having defects, mixed entities, dopants, and other distorting forces, is said to be imperfect. In epitaxial growth, the lattice constant is a measure of the structural compatibility between different materials. Lattice constant ratios govern the growth of thin layers of substances on other substances; when the constants differ, strains are introduced into the layer, which hinder epitaxial growth of thicker layers without defects. Matching of lattice structures between two different semiconductor substances, allows a region of band gap change to be formed in a material without introducing a change in crystal structure. This phenomenon is expressed in quantum wells and allows construction of advanced light-emitting diodes and diode lasers. For example, gallium arsenide, aluminium gallium arsenide, and aluminium arsenide have almost equal lattice constants, making it possible to grow almost arbitrarily thick layers of one on the other one. However, alloys having high indium content will exhibit strain when grown on gallium arsenide layers, and thick layer growth would be hindered. Still there is a critical thickness for each In content that affords a growth of strained layer with minimal lattice defects. The growth of strained layer below the critical thickness is rather common.

Strain between a layer epitaxially grown on a base layer can be quantified as a unit-less value by the ratio of the lattice constant of the base layer "a", namely the ratio between the difference in the lattice constants (the one of the base layer and the epitaxially grown layer, "$\Delta a$") and "a", or $\Delta a/a$ which is typically expressed in percents. For example, the substrate lattice constant of gallium arsenide, $a_{GaAs}$, is 2.45 Å, the lattice constant of indium arsenide, $a_{InAs}$, is 2.61 Å, and thus $\Delta a/a$ ($a_{InAs}-a_{GaAs}/a_{GaAs}$) is 6.9%.

The successful incorporation of such a relative high content of nitrogen atoms in a well-layer having such a high concentration of group-III element atoms (e.g., Indium), is a result of a high level of strain in the atomic layer of the group-III element. Without being bound by any particular theory, it is assumed that nitrogen atoms will remain a part of the chemical composition of the well-layer only if it is strained enough, that is, strained to some optimal level. An accepted theory in the art postulates that the nitrogen incorporation reduces the strain is the driving force to the remaining nitrogen content in the layer.

Hence, according to some embodiments of the present invention, the strain in the first atomic layer formed in the process presented herein is greater than 2 percents, and according to other embodiments, the strain is greater than 5%, 6%, 7% or 10%.

The necessary strain in the first atomic layer formed in the process presented herein, can be realized by allowing an excess of group-III element atoms to deposit on the base-layer and reach a certain thickness. As shown in the Examples section that follows, the optimal thickness can be reached by varying the time period during which the substrate is exposed to the precursor of the group-III element. Hence, according to some embodiments of the present invention, the exposure of the base-layer to the precursor of the group-III element is performed for a time period that ranges from 5 second to 50 seconds.

A too-short exposure will result in a thin and therefore less strained, and partially covered atomic layer, and overexposure will result in a highly strained and disordered layer which has overshot the optimal thickness. A method for optimizing the exposure time is presented in the Examples section that follows. According to some embodiments of the present invention, the time period for exposure to the precursor of the group-III element ranges from 6 second to 10 seconds, and alternatively, the exposure time period is 7 seconds.

The exposure to the nitrogen source is not characterized by a peak-function optimum, and can therefore extend over the time it takes for a full layer of nitrogen atoms to form over the first atomic layer. Without being bound by any particular theory, it is assumed that the nitrogen layer formation is self-terminating.

According to some embodiments of the present invention, the exposure of the base-layer having the first atomic layer, to the nitrogen precursor is performed for a time period that ranges from 5 second to 50 seconds. According to some embodiments of the present invention, this exposure time is 20 seconds.

The second exposure of the substrate to the precursor to the group-III element precursor is also not characterized by a peak-function optimum, and without being bound by any particular theory, it is assumed that the growth of the second atomic layer of group-III element atoms is also self-terminating.

According to some embodiments of the present invention, the exposure of the base-layer having the first atomic layer deposited thereon and the nitrogen absorbed thereto, to the group-III element precursor is performed for a time period that ranges from 5 second to 50 seconds. According to some embodiments of the present invention, this exposure time is 30 seconds.

Another factor that governs the incorporation of nitrogen atoms and inhibit the tendency of nitrogen to escape from the well-layer, is the low temperature at which the well-layer is being formed, relative to the temperature at which the base-layer can be formed. There is therefore a link between the reaction temperature and the content of nitrogen in the final layer.

In general, the base-layer of the quantum wells according to some embodiments of the present invention, can be formed at temperatures similar to that used in any conventional process, since no nitrogen-containing layer is present, however, any other barrier layer which would follow a nitrogen-containing layer prepared according to some embodiments of the present invention, would be formed at a lower temperature so as to promote maintaining as much nitrogen in the well layer as required.

Hence, according to some embodiments of the present invention, the epitaxial growth of the well-layer onto the base-layer is performed at a temperature lower than 650° C., which is typically used in many epitaxy methods including ALE. In some embodiments, the epitaxial growth of the well-layer onto the base-layer is performed at a temperature lower than 600° C. In some embodiments, it is performed at a temperature lower than 550° C. In some embodiments, it is performed at a temperature not higher than 520° C.

In order to keep the nitrogen atoms incorporated in the well-layer, it is desirable that the formation of the cap-layer is also performed at a low temperature, relative to the temperature at which the base-layer can be formed if nitrogen is not present. Hence, according to some embodiments of the present invention, the epitaxial growth of the cap-layer onto the base-layer is performed at a temperature lower than 650° C., which is typically used in many epitaxy methods including ALE. In some embodiments, the epitaxial growth of the well-layer onto the base-layer is performed at a temperature lower than 600° C. In some embodiments, it is performed at a temperature lower than 550° C. In some embodiments, it is performed at a temperature not higher than 520° C.

The thickness of the well-layer depends on the chemical composition thereof as well as on the multiplicity of the monolayers therein, namely the number of monolayers it comprises. A single monolayer is typically not sufficient to produce a useful quantum well, and a well-layer too thick will suffer from distortions of the lattice due to strain and lattice defects. Therefore, it is desirable to produce a well-layer which is a multi-monolayer such as a two-monolayer (as thick as a lattice of two monolayers), a three-monolayer, and in some cases a four-monolayer.

Hence, according to some embodiments of the present invention, the well-layer is a multi-monolayer, e.g., a two-monolayer, a three-monolayer or a four-monolayer. According to some embodiments of the present invention, the well-layer is a two-monolayer layer.

The formation of a multi-monolayer can be controlled by, for example, manipulating the time of exposure to each precursor of an element (layering) comprising the multi-monolayer, or repeating the layering of any of the elements after layering another element.

The formation of a cap-layer over the well-layer completes the formation of the basic quantum well structure. When seeking certain performance from quantum well structures, particularly laser energy output, one has to construct a superlattice structure comprising several quantum well structures layered one on top of the other. According to some embodiments of the present invention, the process of forming one quantum well, which can be regarded as the first period of a superlattice structure, can be extended so as to form an additional well-layer on-top of the cap-layer of the first quantum well (first period), thereby forming a second period in the superlattice structure.

Hence, according to some embodiments of the present invention, the process further includes, subsequent to the epitaxial growth of the first cap-layer, epitaxially growing on the cap-layer an additional well-layer, similar to the firstly grown well-layer, which also includes a group-III element, a group-V element and nitrogen. According to some embodiments of the present invention, the additional well-layer can be different in composition and/or thickness from the firstly grown well-layer.

To complete the period of the superlattice structure, an additional cap-layer is epitaxially grown on-top of the second well-layer. As discussed hereinabove, the cap-layer of the first period serves as a buffer-layer between the two quantum well structures, and serves as the base-layer for the second quantum well.

According to some embodiments of the present invention, a superlattice structure consisting of a repetitive formation of quantum well structures grown according to process presented herein may have from 2 to 6 periods (stacked quantum well structures).

According to some embodiments of the present invention, the process for preparing a quantum well as presented herein, may further include, subsequent to epitaxially growing the cap-layer, epitaxially growing onto this cap-layer, sequentially, a plurality of additional well-layers, each independently comprising a group-III element, a group-V element and nitrogen, and a plurality of additional cap layers. Such a process essentially produces a superlattice structure of a repetitive short-period, or a SPSL.

The process presented herein can afford nitrogen-containing quantum wells which are reproducible and viable, or of superior qualities as compared to equivalent quantum wells not having nitrogen incorporated therein, or compared to equivalent nitrogen-containing quantum wells prepared by other methods and processes.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A method of producing light, comprising applying bias to a light emitting system having an active region which comprises a stack of bilayer quantum well structures separated from each other by barrier layers, each bilayer quantum well structure being formed of a first layer made of a first semiconductor alloy for electron confinement and a second layer made of a second semiconductor alloy for hole confinement, wherein a thickness and composition of each layer is such that a characteristic hole confinement energy of said bilayer quantum well structure is at least 200 meV.

2. The method of claim 1, wherein each of said first and said second semiconductor alloys is a III-V semiconductor alloy incorporated with bandgap modifying atoms.

3. The method of claim 2, wherein said bandgap modifying atoms comprise nitrogen.

4. The method of claim 2, wherein said bandgap modifying atoms comprise bismuth.

5. The method of claim 1, wherein said applying said bias is while said system is at a temperature of about 300K and results in generation of light at a wavelength of from about 1.3 to about 1.55 microns.

6. The method of claim 1, wherein an individual thickness of each layer in said bilayer quantum well structure is such that characteristic thermal escape lifetimes of electrons and holes out of said bilayer quantum well are within less than 20% from each other.

7. The method of claim 1, wherein said first layer comprises GaInAsN, and said layer comprises GaAsSbN, wherein a thickness of said second layer is about 50% of a thickness of said first layer, and wherein an overall thickness of said bilayer quantum well structure is less than 2.5 nanometers.

8. The method of claim 1, wherein said first layer comprises $Ga_yIn_{1-y}As_xN_{1-x}$, said y being from about 0.4 to about 0.6 and said x being from about 0.97 to about 0.995, and said layer comprises $GaAs_{1-z-t}Sb_{z-t}N_t$ said z being from about 0.2 to about 0.3, said t being from about 0.005 to about 0.03.

9. The method of claim 1, wherein a thickness and composition of each layer is such that characteristic valence and conduction band offsets of said bilayer quantum well structure are at least 300 meV each.

10. The method of claim 1, wherein a thickness and composition of each of layer is such that a characteristic electron confinement energy and the characteristic hole confinement energy of said bilayer quantum well structure are within less than 30% from each other.

11. A method, comprising:
  growing on a substrate a first layer made of a first semiconductor alloy for electron confinement; and
  growing on said first layer a second layer made of a second semiconductor alloy for hole confinement, thereby forming a bilayer quantum well structure on said substrate;
  wherein an overall thickness of said bilayer quantum well structure is selected so as to configure a predetermined energy band, and an individual thickness of each layer is selected so as to independently configure a predetermined band offset.

12. The method of claim 11, further comprising growing a barrier layer on said bilayer quantum well structure.

13. The method of claim 11, further comprising:
  growing a barrier layer on said bilayer quantum well structure, and
  repeating said growth of said first and said second layers on said barrier layer to form an additional bilayer quantum well structure on said barrier layer.

14. The method of claim 13, further comprising repeating said growth of said barrier layer, said first layer and said second layer at least once to form stack of bilayer quantum well structures separated from each other by barrier layers.

15. The method of claim 11, wherein each of said first and said second semiconductor alloys is a III-V semiconductor alloy incorporated with bandgap modifying atoms.

16. The method of claim 15, wherein said bandgap modifying atoms comprise nitrogen.

17. The method of claim 15, wherein said bandgap modifying atoms comprise bismuth.

18. The method of claim 11, wherein an overall thickness of said bilayer quantum well structure is selected to allow generation of light at a wavelength of from about 1.4 to about 1.55 microns at a temperature of about 300K.

19. The method of claim 11, wherein an individual thickness of each layer in said bilayer quantum well structure is such that characteristic thermionic escape lifetimes of electrons and holes out of said bilayer quantum well are within less than 20% from each other.

20. The method of claim 11, wherein said first layer comprises GaInAsN, and said layer comprises GaAsSbN, wherein a thickness of said second layer is about 50% of a thickness of said first layer, and wherein an overall thickness of said bilayer quantum well structure is less than 2.5 nanometers.

21. The method of claim 11, wherein said first layer comprises $Ga_y In_{1-y} As_x N_{1-x}$, said y being from about 0.4 to about 0.6 and said x being from about 0.97 to about 0.995, and said layer comprises $GaAs_{1-z-t} Sb_{z-t} N_t$, said z being from about 0.2 to about 0.3, said t being from about 0.005 to about 0.03.

22. The method of claim 11, wherein a thickness and composition of each layer is such that characteristic valence and conduction band offsets of said bilayer quantum well structure are at least 300 meV each.

23. The method of claim 11, wherein a thickness and composition of each of layer is such that a characteristic electron confinement energy and the characteristic hole confinement energy of said bilayer quantum well structure are within less than 30% from each other.

24. A light emitting system, comprising an active region having a stack of bilayer quantum well structures separated from each other by barrier layers, each bilayer quantum well structure being formed of a first layer made of a first semiconductor alloy for electron confinement and a second layer made of a second semiconductor alloy for hole confinement, wherein a thickness and composition of each layer is such that a characteristic hole confinement energy of said bilayer quantum well structure is at least 200 meV.

25. The system of claim 24, wherein said stack is on a GaAs substrate.

26. The system of claim 24, wherein each of said first and said second semiconductor alloys is a III-V semiconductor alloy incorporated with bandgap modifying atoms.

27. The system of claim 26, wherein said bandgap modifying atoms comprise nitrogen.

28. The system of claim 26, wherein said bandgap modifying atoms comprise bismuth.

29. The system of claim 24, wherein an individual thickness of each layer in said bilayer quantum well structure is such that characteristic lifetimes of electrons and holes in said bilayer are within less than 20% from each other.

30. The system of claim 24, wherein said first layer comprises GaInAsN, and said layer comprises GaAsSbN, wherein a thickness of said second layer is about 50% of a thickness of said first layer, and wherein an overall thickness of said bilayer quantum well structure is less than 2.5 nanometers.

31. The system of claim 24, wherein said first layer comprises $Ga_y In_{1-y} As_x N_{1-x}$, said y being from about 0.4 to about 0.6 and said x being from about 0.97 to about 0.995, and said layer comprises $GaAs_{1-z-t} Sb_{z-t} N_t$, said z being from about 0.2 to about 0.3, said t being from about 0.005 to about 0.03.

32. The system of claim 24, wherein a thickness and composition of each layer is such that characteristic valence and conduction band offsets of said bilayer quantum well structure are at least 300 meV each.

33. The system of claim 24, wherein a thickness and composition of each of layer is such that a characteristic electron confinement energy and the characteristic hole confinement energy of said bilayer quantum well structure are within less than 30% from each other.

* * * * *